(12) United States Patent
Clark et al.

(10) Patent No.: US 10,854,942 B2
(45) Date of Patent: Dec. 1, 2020

(54) RADIO FREQUENCY CONNECTION ARRANGEMENT

(71) Applicant: Cambium Networks Limited, Ashburton (GB)

(72) Inventors: Paul Clark, Paignton (GB); Peter Strong, Ipplepen (GB); Carl Morrell, Kingsteignton (GB); Adam Wilkins, Plymouth (GB); Nigel Jonathan Richard King, Rattery (GB)

(73) Assignee: CAMBIUM NETWORKS LTD, Ashburton (GB)

( * ) Notice: Subject to any disclaimer, the term of this patent is extended or adjusted under 35 U.S.C. 154(b) by 0 days.

(21) Appl. No.: 16/272,834

(22) Filed: Feb. 11, 2019

(65) Prior Publication Data

US 2019/0190110 A1 Jun. 20, 2019

Related U.S. Application Data

(63) Continuation of application No. PCT/GB2017/052373, filed on Aug. 11, 2017.

(30) Foreign Application Priority Data

Aug. 12, 2016 (GB) .................................. 1613864.6

(51) Int. Cl.
*H01P 5/02* (2006.01)
*H01P 3/08* (2006.01)
*H05K 1/02* (2006.01)

(52) U.S. Cl.
CPC .............. *H01P 5/028* (2013.01); *H01P 3/081* (2013.01); *H05K 1/0237* (2013.01); *H05K 2201/09209* (2013.01); *H05K 2201/10242* (2013.01)

(58) Field of Classification Search
CPC .......... H01P 3/081; H01P 5/028; H01P 5/184; H05K 1/0237; H05K 2201/09209; H05K 2201/10242; H05K 1/0239

(Continued)

(56) References Cited

U.S. PATENT DOCUMENTS

2002/0158722 A1 10/2002 Mauhashi et al.
2013/0328646 A1 12/2013 Kondou et al.
2014/0240191 A1* 8/2014 Lee ........................ H01Q 13/18
343/852

FOREIGN PATENT DOCUMENTS

EP 0 671 777 A1 9/1995
GB 2535218 A 8/2016

(Continued)

OTHER PUBLICATIONS

Machine English Translation of JP2004187281 Published on Jul. 2, 2004 (Year: 2004).*

(Continued)

*Primary Examiner* — Rakesh B Patel
*Assistant Examiner* — Jorge L Salazar, Jr.
(74) *Attorney, Agent, or Firm* — Brinks Gilson & Lione

(57) ABSTRACT

A radio frequency transmission arrangement comprises a ground plate having an aperture comprising a slot with an elongate cross-section and substantially parallel sides, and a first and second transmission line. The thickness of the ground plate is greater than a width of the slot. The aperture is partially filled with a solid dielectric material and partially filled with air. The first transmission line comprises a first elongate conductor on a first side of the ground plate and has an end terminated with a first termination stub. The second transmission line comprises a second elongate conductor on the opposite side of the ground plate and has an end terminated with a second termination stub. The first transmission line is arranged to cross the slot at a point adjacent (Continued)

to the first termination stub, and the second transmission line is arranged to cross the slot at a point adjacent to the second termination stub.

20 Claims, 8 Drawing Sheets

(58) Field of Classification Search
USPC .................................... 333/24 R, 238, 246
See application file for complete search history.

(56) References Cited

FOREIGN PATENT DOCUMENTS

JP      H0697724        4/2004
JP      2004187281 A    7/2004

OTHER PUBLICATIONS

International Search Report and Written Opinion of the International Searching Authority in PCT Application No. PCT/GB2017/052373, dated Nov. 20, 2017.

Schueppert, B.: Microstrip/Slotline Transitions: Modeling and Experimental Investigation, IEEE Transactions on Microwave Theory and Techniques, Plenum, USA; vol. 36, No. 8, Aug. 1, 1988, pp. 1272-1282.

\* cited by examiner

RADIO FREQUENCY CONNECTION ARRANGEMENT

CROSS-REFERENCE TO RELATED APPLICATIONS

This application is a continuation of International Application No. PCT/GB2017/052373, filed Aug. 11, 2017, which is published as International Publication No. WO 2018/029486, which is incorporated by reference in its entirety herein, and which claims the benefit of UK Application No. GB 1613864.6, filed Aug. 12, 2016, published as GB Publication No. GB 2552836, which is also incorporated by reference in its entirety herein.

TECHNICAL FIELD

The present disclosure relates generally to a radio frequency circuit implementation for connecting a transmission line to another a transmission line, and more specifically, but not exclusively, to a radio frequency transmission arrangement for connecting a radio frequency signal from a transmission line on one side of a ground plate to a transmission line on the other side of the ground plate.

BACKGROUND

In modern wireless systems, such as for example cellular wireless and fixed radio access wireless networks, there is a need for equipment operating with radio frequency signals, such as radio transceiver equipment in user equipment or at base stations or access points, which is economical to produce, while having high performance at radio frequencies. Increasingly high radio frequencies are being used as spectrum becomes scarce and demand for bandwidth increases. Furthermore, antenna systems are becoming increasingly sophisticated, often employing arrays of antenna elements to provide controlled beam shapes and/or MIMO (multiple input multiple output) transmission. Typically, radio frequency circuits are constructed with unbalanced transmission lines for transmission of radio frequency signals between components of the circuit, such as between amplifiers, filters, detectors, antennas and many other types of radio frequency component. An unbalanced transmission line comprises a signal conductor, such as a printed track of a circuit board, and a ground structure, such as a ground plane of a circuit board or a conductive ground plate, such as a milled aluminium plate. If one transmission line is connected to another transmission line, the signal conductor of one transmission line needs to be connected, at least at radio frequency, to the signal conductor of the other transmission line. It is also important that there is a good radio frequency connection between the ground structures of the respective transmission lines. This ensures a low loss connection between the transmission lines and, by ensuring that the conductors are referenced to the same ground voltage, reduces pick up of spurious signals.

Electronic equipment may be constructed with a ground plate having radio frequency electronic circuitry on both sides of it. For example, a ground plate may be a backing plate for an antenna array, and a radio transceiver may be mounted on the other side of the backing plate from the antenna array. There is typically a need to connect signals from one side of the ground plate to the other, for example between the antenna array and the transceiver.

Conventionally, signals may be connected through a ground plate using co-axial radio frequency connectors. Such co-axial connectors are typically made to tight mechanical tolerances and are relatively expensive, often being gold pated for example to ensure a good electrical connection and avoid corrosion. A poorly made or corroded connector may result in a poor radio frequency connection, resulting in signal loss or may even produce a connection with non-linear transmission characteristics resulting in generation of spurious signal components. There is a need for a low cost, high performance radio frequency connection, preferably tolerant of mechanical misalignment, between a transmission line on one side of a ground plate and a transmission line on the other side of the ground plate.

It is known to couple radio frequency signals between transmission lines on different layers of a printed circuit board using slot-coupled interconnects. The publication "Slot-Coupled Double-Sided Microstrip Interconnects and Couplers" by Ho, Fan and Chang, 1993 IEEE MTT-S Digest, discloses slot-coupled interconnects for coupling radio frequency signals between layers of a multi-layer printed circuit board, through an aperture in a ground plane forming a layer of the printed circuit board.

SUMMARY

In accordance with a first aspect of the present disclosure, there is provided a radio frequency connection arrangement comprising:

a ground plate having first and second opposite sides and an aperture passing through the ground plate from the first side to the second side, the aperture comprising a slot, the slot having an elongate cross-section in the plane of the first side of the ground plate, the cross-section having substantially parallel sides extending along the length of the cross section, and the slot having a width which is the distance between the parallel sides of the cross-section of the slot;

a first transmission line comprising a first elongate conductor disposed on the first side of the ground plate in a substantially parallel relationship with the first side of the ground plate, the first transmission line having an end terminated with a first termination stub; and a second transmission line comprising a second elongate conductor disposed on the second side of the ground plate in a substantially parallel relationship with the second side of the ground plate, the second transmission line having an end terminated with a second termination stub, wherein the first transmission line is arranged to cross the slot at a point adjacent to the first termination stub, and the second transmission line is arranged to cross the slot at a point adjacent to the second termination stub, wherein the thickness of the ground plate is greater than a width of the slot, and wherein the aperture is partially filled with a solid dielectric material and partially filled with air.

This allows signals to be coupled from the first transmission line on one side of a ground plate to the second transmission line on the other side, and vice versa, without an electrically conductive connection between the conductors of the first and second transmission lines. This provides a connection which causes low loss to radiofrequency signals, and avoids introducing intermodulation distortion due to metal-to-metal connections. The thickness of the ground plate, greater than the slot width, allows the ground plate to provide mechanical support. It has been found that an aperture through a thick ground plate may be used to couple signals from one side to the other with low loss. Filling the aperture partially with a solid dielectric material and partially with air allows a lower operating frequency to be achieved for given overall dimensions of the aperture while providing low loss.

In an embodiment of the disclosure, the aperture comprises a termination cavity at each end of the slot, and each termination cavity is at least partially filled with the solid dielectric material. The termination cavities improve coupling of radio frequency signals through the aperture, giving low loss. At least partially filling the termination cavities with the solid dielectric material allows a lower operating frequency to be achieved for given size of the termination cavities.

In an embodiment of the disclosure, each termination cavity is filled with the solid dielectric material and the slot is filled with air. This allows a reduction in size of the aperture for operation at a given operating frequency, by reduction in the size of the termination cavities, while allowing low loss by filling the slot, through which transmission predominantly occurs, with air, which has a lower dielectric loss than a solid dielectric material.

In an embodiment of the disclosure, each termination cavity is cylindrical. This provides a convenient implementation.

In an embodiment of the disclosure, each cylindrical terminating cavity has a diameter of substantially 0.1 of a wavelength in the solid dielectric material at an operating frequency of the radio frequency transmission structure. This provides a low loss implementation. The wavelength in the solid dielectric material is less than the wavelength would be in air.

In an embodiment of the disclosure, each cylindrical terminating cavity has a circumference of substantially a quarter of a wavelength in the solid dielectric material at an operating frequency of the radio frequency transmission structure. This provides a low loss implementation.

In an embodiment of the disclosure, the solid dielectric material is a material suitable for use as a printed circuit board substrate material, which may be an epoxy-glass composite material. This provides a convenient material with low radio frequency loss.

In an embodiment of the disclosure, the ground plate is composed of a non-conductive moulding having an electrically conductive coating.

This allows the ground plate to be light weight and to be moulded in a shape to include the aperture, which may be an economical manufacturing method. The non-conductive moulding may comprises a plastic material and the conductive surface may comprise copper.

In an embodiment of the disclosure, the ground plate is composed of metal, which may be cast aluminium. This provides a ground plate with good strength. The apertures may be economically produced by moulding.

In an embodiment of the disclosure, the thickness of the ground plate is greater than four times the width of the slot. This allows signals to be coupled with low loss through a particularly thick ground plate.

In an embodiment of the disclosure, the width of the slot is greater than 1 mm and the thickness of the ground plate is greater than 5 mm. Preferably, the width of the slot is in the range 1 to 3 mm and the thickness of the ground plate is in the range 5 to 15 mm. This provides a combination of low loss radio frequency coupling and economical manufacturing due to the avoidance of tight dimensional tolerances.

In an embodiment of the disclosure, the slot has a length of less than a wavelength in air at an operating frequency of the radio frequency transmission arrangement. This improves coupling of radio frequency signals through the aperture, giving low loss.

In an embodiment of the disclosure, the slot has a length of less than 0.3 of a wavelength in air at an operating frequency of the radio frequency transmission arrangement. This gives a compact implementation of the radio frequency transmission arrangement with low loss.

In an embodiment of the disclosure, the first transmission line crosses the slot directly opposite the point where the second transmission line crosses the slot.

This allows the first transmission line to be arranged to be directly above the second transmission line.

In an embodiment of the disclosure, the first transmission line crosses the slot at a point offset along the slot from the point where the second transmission line crosses the slot.

This allows the first and second transmission lines to be offset horizontally. This may be convenient in some circuit layouts.

In an embodiment of the disclosure, the first and second terminating stubs have a diameter of substantially 0.1 of a wavelength at an operating frequency of the radio frequency transmission structure.

This provides a low loss implementation.

In an embodiment of the disclosure, the ground plate has a protrusion from the second side, the protrusion being arranged to pass through an opening in a metal plate disposed in a substantially parallel relationship with the ground plate, and the aperture being arranged to pass through the protrusion, whereby to provide a radio frequency connection through the metal plate to the second transmission line.

This allows a metal plate to be used to reinforce the ground plate, without affecting the radio frequency performance of the coupling between the first and second transmission lines through the aperture, since the aperture need not be formed in two materials having a joining surface between them.

In an embodiment of the disclosure, the radio frequency transmission arrangement comprises an electrically conductive enclosure disposed on the first side of the ground plate, the electrically conductive enclosure being electrically connected to the ground plate, and having a cavity facing the first side of the ground plate, the walls and top of the cavity being arranged to surround and to cover the aperture and at least part of the first transmission line. This allows a low loss implementation by coupling radio frequency signals efficiently between the aperture and the first transmission line, avoiding loss due to radiation from the aperture and/or the first transmission line.

In an embodiment of the disclosure, the electrically conductive enclosure has an entrance tunnel through a wall of the cavity, the entrance tunnel covering at least part of the first transmission line, whereby to allow the first transmission line to enter the cavity.

This provides a convenient way of allowing the first transmission line to enter the cavity while maintaining low loss.

In an embodiment of the disclosure, the distance between the top of the cavity and the first transmission line is at least twice the distance between the top of the tunnel and the first transmission line. It has been found that, for improved coupling with the aperture, the height of the top of the cavity above the first transmission line, in the vicinity of the aperture, is preferably greater than the distance between the ground plate and the first transmission line, whereas, in the tunnel, the first transmission line is preferably equidistant between the ground plate and the top of the cavity to provide controlled impedance and so good return loss.

In an embodiment of the disclosure, the first transmission line is formed by a printed track on a flexible film, disposed with an air gap between the polyester film and the ground plate, wherein the distance between the flexible film and the ground plate is substantially the same as the distance between the flexible film and the top of the tunnel. This provides a low loss implementation of the first transmission line due to the dielectric material being predominantly air, while having the distance between the flexible film and the ground plate is substantially the same as the distance between the flexible film and the top of the tunnel reduces the effect on impedance of displacement of the film.

Further features and advantages of the disclosure will be apparent from the following description of preferred embodiments of the disclosure, which are given by way of example only.

DETAILED DESCRIPTION

By way of example, embodiments of the disclosure will now be described in the context of a radio frequency connection arrangement in which a radio frequency transmission path is provided from one side of a ground plate to the opposite side of a ground plate, the ground plate being a backing plate for an array of printed antenna elements.

However, it will be understood that this is by way of example only and that other embodiments may involve transmission paths between transmission lines having various grounding arrangements, not necessarily in the context of antenna systems, where a radio frequency connection is desired between a transmission line on one side of a grounded structure and another transmission line on the other side of a grounded structure. In an embodiment of the disclosure disclosure, an operating frequency of approximately 5 GHz is used, but the embodiments of the disclosure are not restricted to this frequency, and lower operating frequencies of 1 GHz or less and higher operating frequencies of up to 60 GHz or higher frequencies may be used.

Figure 1:
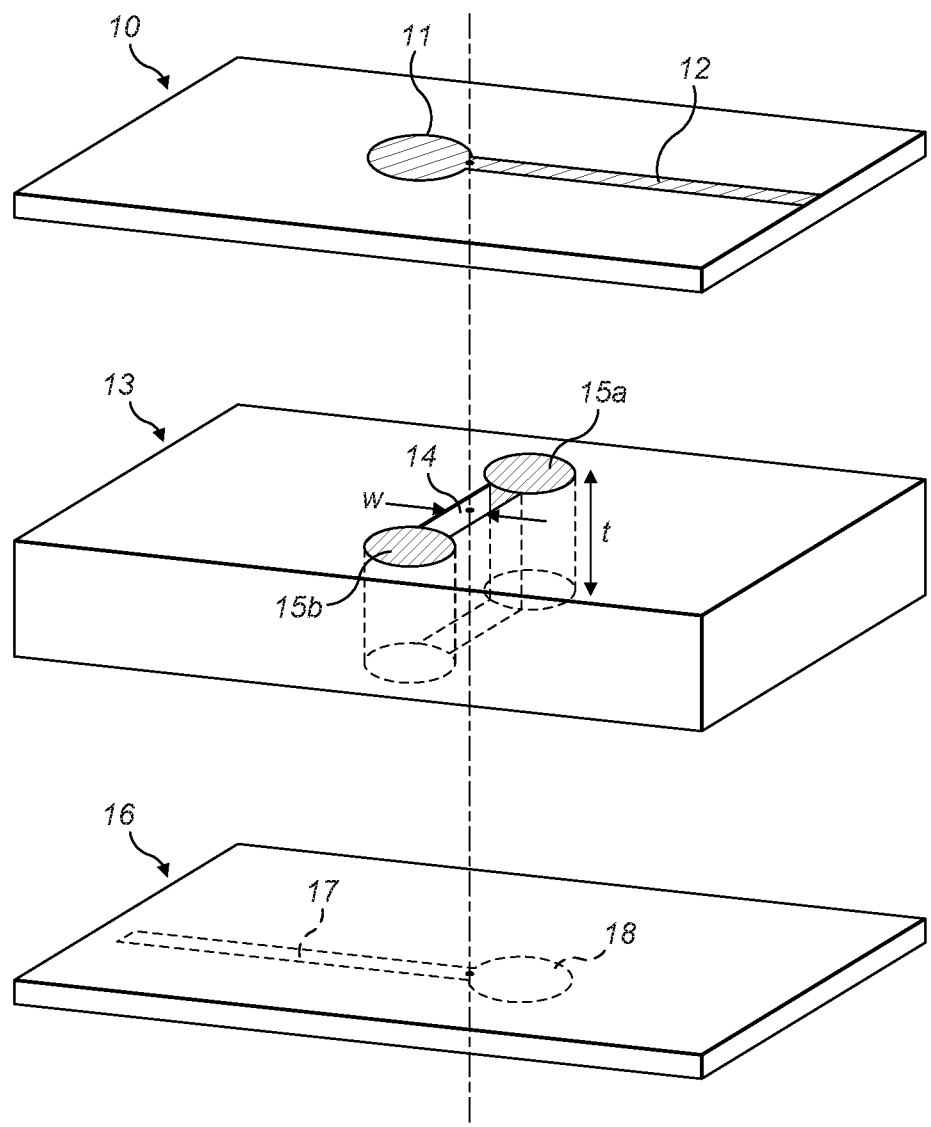
FIG. 1 is a schematic diagram showing an exploded view of a radio frequency transmission arrangement in an embodiment of the disclosure.
Figure 2:
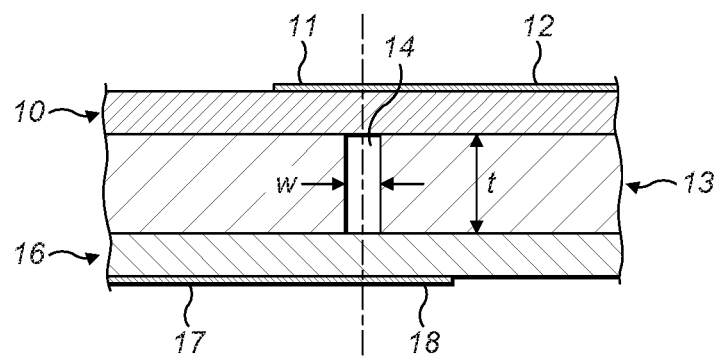
FIG. 2 is a schematic diagram showing a cross section of the radio frequency transmission arrangement of FIG. 1 in an embodiment of the disclosure.

FIG. 1 shows an exploded view of a radio frequency connection arrangement in an embodiment of the disclosure arranged to connect radio frequency signals from a first transmission line comprising signal conductor 12 through a ground plate 13, to a second transmission line on the other side of the ground plate comprising signal conductor 17. FIG. 2 shows a cross-section of the radio frequency arrangement of FIG. 1. As can be seen in FIGS. 1 and 2, the ground plate 13 is provided with an aperture 14, 15a, 15b passing through the ground plate from the one side of the ground plate 13 to the opposite side. The aperture comprises a slot 14, which has parallel sides, and may also comprise termination cavities 15a, 15b at each end of the slot as shown in FIG. 1. The thickness of the ground plane t is greater than the width of the slot w, typically by a factor of 4 or more. A slot width of 2 mm has been found to give good coupling performance with a ground plane thickness of 10 mm, for example. Signals are coupled through the aperture from the first transmission line to the second transmission line, and vice versa. This allows signals to be coupled through the ground plate without an electrically conductive connection between the conductors of the first and second transmission lines. As a result, the use of co-axial connectors is avoided, saving cost, and mechanical construction tolerances are relaxed, in particular when more than one connection is provided through a ground plate. Furthermore, this provides a connection which causes low loss to radiofrequency signals, and avoids introducing intermodulation distortion due to metal-to-metal connections. As shown in FIG. 1, the aperture 14, 15a, 15b is filled partially with a solid dielectric material, in this example shown by shading of parts 15a and 15b, and partially with air, shown by the absence of shading in part 14. This allows a lower operating frequency to be achieved for given overall dimensions of the aperture while maintaining low loss. This may also be seen a reducing the size of the aperture for a given operating frequency. In the embodiment of FIG. 1, the aperture comprises a termination cavity 15a, 15b at each end of the slot, and each termination cavity is at least partially filled with the solid dielectric material. The termination cavities 15a, 15b improve coupling of radio frequency signals through the aperture, giving low loss. At least partially filling the termination cavities 15a, 15b with the solid dielectric material allows a lower operating frequency to be achieved for given size of the termination cavities.

In the embodiment of FIG. 1, each termination cavity 15a, 15b is filled with the solid dielectric material and the slot is filled with air. For example, for a 2 mm slot width, with the slot filled with air and the termination cavities loaded with FR4 epoxy-glass material, the minimum operating frequency for 1 dB loss may be 3.2 GHz, whereas for the same size of aperture, if the termination cavities and the slot were both filled with air, the minimum operating frequency for 1 dB loss may be 3.7 GHz.

As shown in FIG. 1, the solid dielectric material may be cylindrical. This allow for convenient manufacturing, but it is not essential that the solid dielectric material is this shape. For example, the solid dielectric material may be partially cylindrical, with a flat edge interfacing with the slot, or other variations of shape. These various shapes may be interpreted as "filling" the termination cavities. This allows a reduction in size of the aperture for operation at a given operating frequency, by reduction in the size of the termination cavities 15a, 15b, while allowing low loss by filling the slot 14 with air. It is thought that transmission through the slot 14 operates in a mode similar to that of slab line, and that transmission is predominantly through the slot 14 rather than in the termination cavities 15a, 15b, so that it is thought that it is advantageous in terms of providing lower loss to use an air dielectric in the slot, because air has a low dielectric loss factor. A size reduction may be achieved by placing a solid dielectric in the terminating cavities, where the loss factor of the dielectric has less effect than it would in the slot. The wavelength in the solid dielectric material is less than the wavelength would be in air in proportion to the square root of the relative permittivity of the solid dielectric material, so a a given requirement in terms of wavelengths, a size reduction is achieved.

In an alternative embodiment, the slot may be filled with a solid dielectric and the terminating cavities filled with air. This may have a somewhat higher loss, but may still achieve a size reduction. This approach may have the advantage that the filling of the slot may be more easily manufactured from a flat sheet of dielectric material, such as printed circuit board substrate.

In the embodiment of FIG. 1, each termination cavity 15a, 15b is cylindrical. Each cylindrical terminating cavity has a diameter of substantially 0.1 of a wavelength in the solid dielectric material at an operating frequency of the radio frequency transmission structure, which approximately corresponds to a circumference of substantially a quarter of a wavelength. It has been found that this provides a low loss implementation.

In an embodiment of the disclosure, the solid dielectric material is a material suitable for use as a printed circuit board substrate material, which may be an epoxy-glass composite material, such as the well-known FR4 material. Other printed circuit board material intended specifically for low loss RF applications may be used such as Duroid. In alternative embodiments, a solid dielectric material with a higher relative permittivity may be used, such as a ceramic material.

Figure 3:
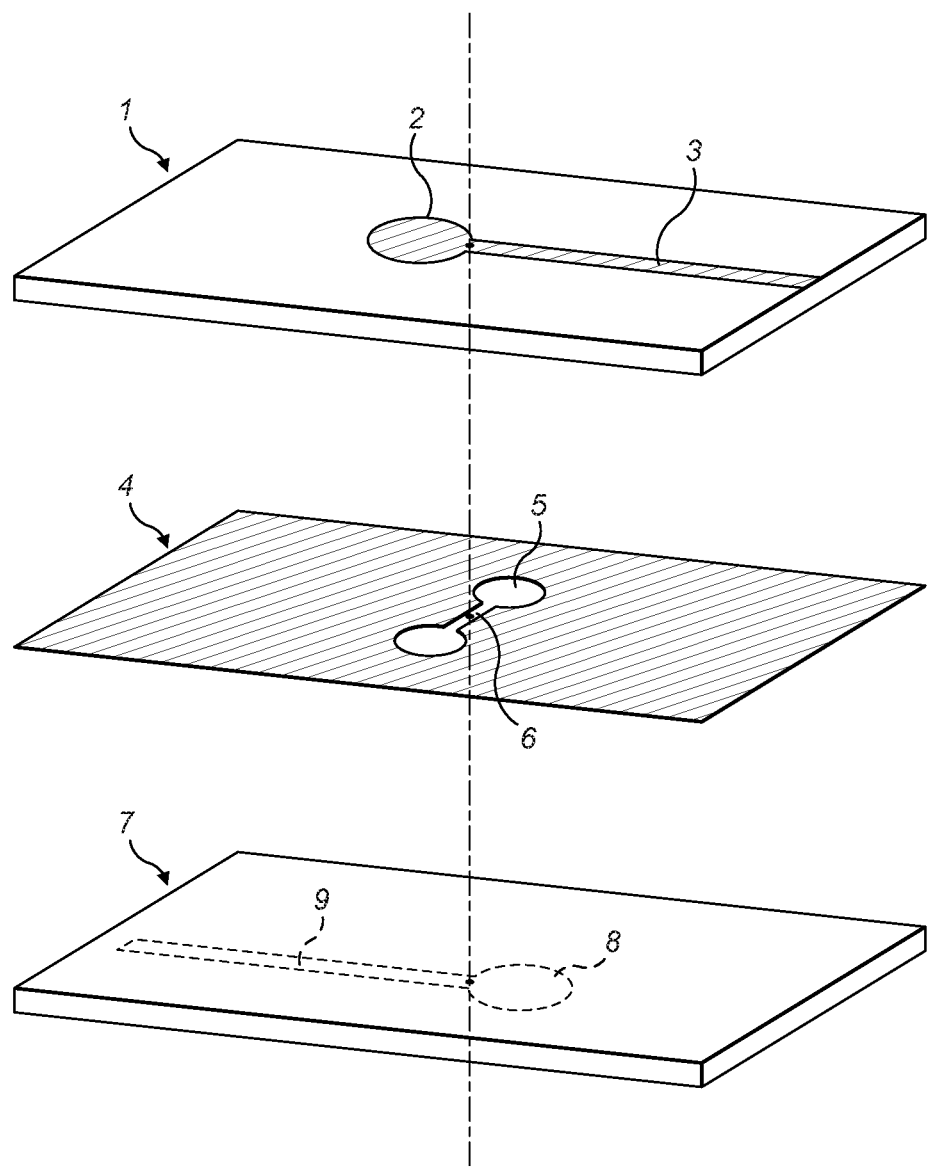
FIG. 3 is a schematic diagram showing an exploded view of a slot-coupled interconnect according to the prior art.
Figure 4:
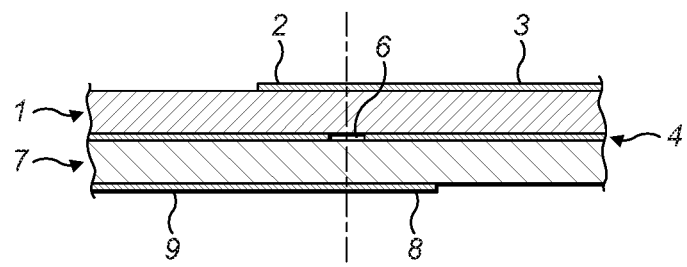
FIG. 4 is a schematic diagram showing a cross section of the slot-coupled interconnect of FIG. 3.

As shown in FIGS. 3 and 4, it is known to provide slot-coupled interconnect connections between signal tracks on different layers of a printed circuit board. A conventional via connection between layers of a printed circuit board is provided by a plated through hole, being a hole drilled through the board to intercept the tracks to be joined, and plated with copper to connect the intercepted tracks electrically. In a slot-coupled interconnect as disclosed in the publication "Slot-Coupled Double-Sided Microstrip Interconnects and Couplers" by Ho, Fan and Chang, 1993 IEEE MTT-S Digest, and as illustrated by FIGS. 3 and 4, radio frequency signals are coupled between layers of a multi-layer printed circuit board, through an aperture in a ground plane forming a layer of the printed circuit board. As shown in exploded view in FIG. 3 and in cross-section in FIG. 4, a signal track 3 is printed on a dielectric substrate layer 1 of a printed circuit board and has a terminating stub 2. The layer in the printed circuit board below the substrate layer 1 is a ground plane 4, typically composed of a thin layer of copper. The copper layer has a dumbbell-shaped aperture comprising a slot 6 between terminating parts 5. Below the ground plane 4 is another dielectric substrate layer 7, on the lower side of which is printed another signal track 9 which has a terminating stub 8. Signals are coupled from one signal track through the aperture to the other signal track.

The ground plane of FIGS. 3 and 4, being a layer of a multilayer board, is thin, and much thinner than the width of the slot. It is not at all obvious that signals could be coupled with low loss through an aperture in a ground plate having significant thickness, let alone a ground plate that is thicker than the width of the slot. Radio frequency fields would be expected to be different in a deep, three-dimensional aperture as compared to the fields in an essentially 2 dimensional ground plane.

Returning to FIGS. 1 and 2, a ground plate 13 has first and second opposite sides and an aperture 14, 15a, 15b passing through the ground plate from the first side to the second side, the aperture comprising a slot 14. As can be seen, the slot 14 has an elongate cross-section in the plane of the first side of the ground plate, and the cross-section has substantially parallel sides extending along the length of the cross section. The slot has a width w which is the distance between the parallel sides of the cross-section of the slot as shown in FIG. 1.

Signal transmission in the connection arrangement is reciprocal, so the arrangement may be used to connect radio frequency signals from the first transmission line to the second transmission line or from the second transmission line to the first transmission line. The first transmission line comprises a signal track, or first elongate conductor, 12, which in the embodiment of FIGS. 1 and 2 is printed on a dielectric substrate 10, and the ground plate 13 provides a ground reference for the first transmission line. The ground plate may be a backing plate providing a ground reference and mechanical support for an array of patch antenna elements which are connected to the first transmission line by a feed network.

The second transmission line comprises a second signal track, or second elongate conductor 17 printed on a dielectric substrate 16 and the ground plate 13 similarly provides a ground reference for the second transmission line. The second transmission line may be connected to a radio transceiver circuit board, the radio transceiver being arranged to transmit and/or receive using the antenna array. The ground plate may have a substantially planar surface underlying the first transmission line, which may include apertures or hollows, for example resonant cavities for patch antennas, and may have a non-uniform cross-section, for example comprising fixing posts. The ground plate may, for example, be milled from an aluminium block, cast, or moulded. The term "ground" is used to mean a radio frequency reference, for example for an unbalanced transmission line, which does not necessarily require a direct current (DC) connection to an electrical ground or earth. The first and second transmission lines are unbalanced transmission lines referenced to the ground plate.

As may be seen, the first transmission line comprises a first elongate conductor 12 disposed on the first side of the ground plate in a substantially parallel relationship with the first side of the ground plate. In the embodiment of FIG. 1, a dielectric substrate 10, such as epoxy resin circuit board material, separates the first elongate conductor from the ground plate. In the embodiment shown, the spacing between the first elongate conductor and the ground plate is greater than the thickness of the ground plate.

The second transmission line comprises a second elongate conductor 17 disposed on the second side of the ground plate 13 in a substantially parallel relationship with the second side of the ground plate. As can be seen in FIG. 1, the second transmission line has the second elongate conductor 17 terminated with a termination stub 18. In the embodiment shown in FIG. 1, the terminating stub 18 of the second transmission line has a diameter of substantially 0.1 of a wavelength at an operating frequency of the radio frequency transmission structure, which has been found to provide a low loss implementation. The terminating stub 18 provides a match to the characteristic impedance of the transmission line, which may be typically 50 Ohms, in conjunction with the impedance presented by the aperture. The spacing between the second elongate conductor and the ground plate may be greater than the thickness of the ground plate.

In the embodiment of FIG. 1, the first transmission line has the first elongate conductor 12 also terminated with a termination stub 11, typically having the same dimensions as the terminating stub of the second transmission line.

It can be seen that the first transmission line is arranged to cross the slot, in the embodiment of FIG. 1 at a point adjacent to the termination stub 11, and the second transmission line is also arranged to cross the slot, at a point adjacent to the termination stub 18.

The ground plate may be composed of a non-conductive moulding, for example a moulding of a plastics material, having an electrically conductive coating, for example copper, allowing the ground plate to be light weight and to be moulded in a shape to include the aperture. This may provide an economical manufacturing method, and it has bene found that apertures may be economically produced by moulding. In particular, it has been found that apertures having slots of width of 2 mm or greater are particularly suitable for production by moulding.

Alternatively, the ground plate is composed of metal, for example cast aluminium, which may provide good strength.

It has been found that the width of the slot is advantageously greater than 1 mm and the thickness of the ground plate is advantageously greater than 5 mm. Preferably, the width of the slot is in the range 1 to 3 mm and the thickness of the ground plate is in the range 5 to 15 mm. This provides a combination of low loss radio frequency coupling and economical manufacturing due to the avoidance of tight dimensional tolerances.

In the embodiment shown in FIGS. 1 and 2, the aperture comprises a termination cavity 15a, 15b at each end of the slot 14. The termination cavity may, for example, be cylindrical as shown. As already mentioned, the termination cavities may be filled with a solid dielectric material. The provision of termination cavities improves coupling of radio frequency signals through the aperture, giving low loss and extended bandwidth. In an embodiment of the disclosure, the slot has a length of less than a wavelength at an operating frequency of the radio frequency transmission arrangement, which improves coupling of radio frequency signals through the aperture, giving low loss. It has been found that a slot having a length of less than 0.3 of a wavelength at an operating frequency of the radio frequency transmission arrangement gives a compact implementation of the radio frequency transmission arrangement with low loss. Typically a slot length of 0.2 wavelengths, the slot length excluding the diameter of the cylindrical terminating cavities 15a, 15b, has been found to give good performance. It has been found that the ratio of the length of the slot to the width of the slot is related to the characteristic impedance of the slot, which may act in a slab line transmission mode.

Providing each substantially cylindrical terminating cavity with a diameter of substantially 0.1 of a wavelength at an operating frequency of the radio frequency transmission structure in the dielectric material filling the termination cavities has also been found to give good performance, providing a low loss implementation.

In the embodiment shown in FIGS. 1 and 2, the first transmission line crosses the slot directly opposite the point where the second transmission line crosses the slot, allowing the first transmission line to be arranged to be directly above the second transmission line.

Figure 5:
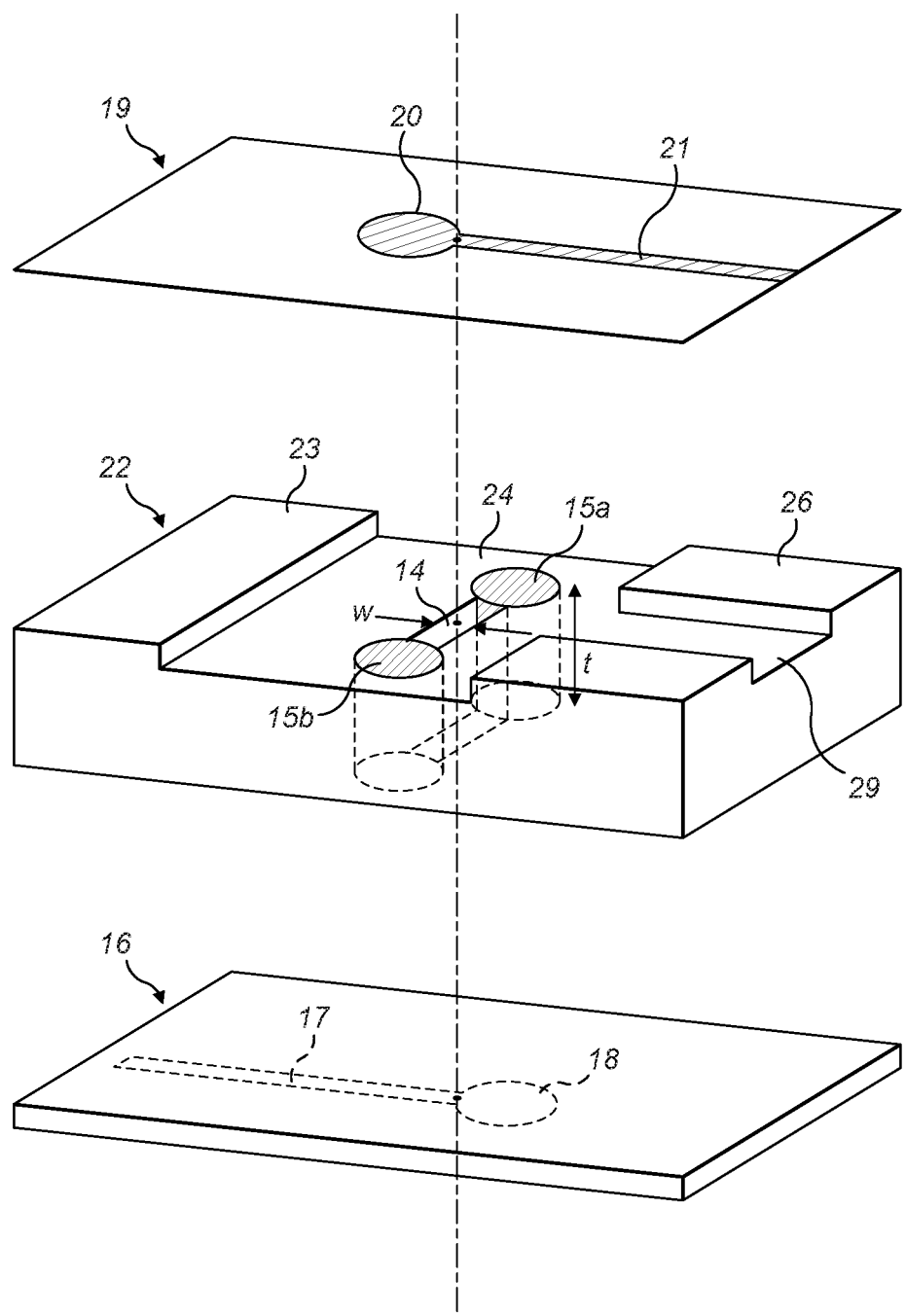
FIG. 5 is a schematic diagram showing an exploded view of a radio frequency transmission arrangement in which the first transmission line is printed on a thin dielectric film in an embodiment of the disclosure.

FIG. 5 shows an embodiment of the disclosure in which the first transmission line is formed by a printed track 21 on a flexible film 19, disposed with an air gap between the flexible film and the ground plate. The flexible film may be a polyester film and may be very thin, typically 0.05 mm or less thick. This reduces dielectric loss effects as the electric fields between the conductor and the ground plate are mainly in air. This gives a low loss implementation with good coupling. As shown in FIG. 5, raised sections of the ground plate 23, 26 may be provided to support the polyester film, or film made of another dielectric material, maintaining the air gap. The second transmission line may be formed with a dielectric film and air gap in a similar manner to the first transmission line. Optionally, grounded conductive covers may be provided over the first transmission line 21 and/or the second transmission line 17, arranged to cover the termination stubs 18, 20 also. The second transmission line, in the embodiment shown, comprises a printed microstrip track 17 on a dielectric substrate 16. The covers are sufficiently separated from the transmission lines to avoid changes in the microstrip behaviour but help avoid radiation loss. For example, the separation of the cover from the transmission line may be greater than the separation of the transmission line from the grounds plate 22. The ground plate 22 may have recessed regions 24, 29.

Figure 6:
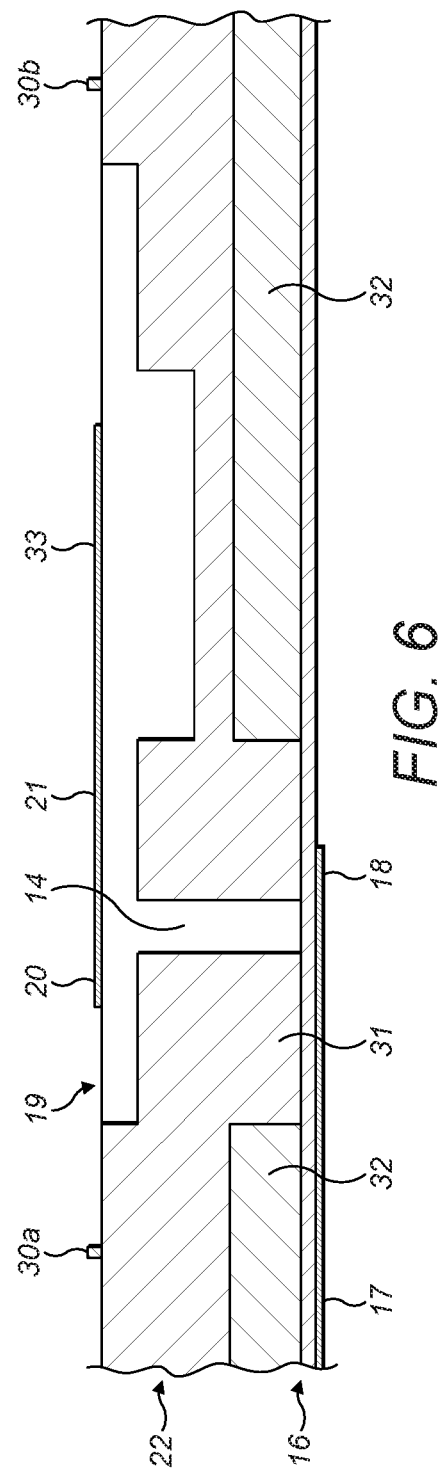
FIG. 6 is a schematic diagram showing a cross-section of a radio frequency transmission arrangement in which the first transmission line is printed on a thin dielectric film an in which the ground plate has a projection projecting through an opening in a metal plate in an embodiment of the disclosure.

FIG. 6 shows a cross section of an embodiment of the disclosure, in which the ground plate 22 has a protrusion 31 from the second side, the protrusion being arranged to pass through an opening in a metal plate 32 disposed in a substantially parallel relationship with the ground plate. The aperture 14 is arranged to pass through the protrusion, so that a radio frequency connection is provided through the metal plate 32 to the second transmission line 17.

The metal plate 32 may be used to reinforce the ground plate, and to provide heat sinking. The ground plate may be plated plastic, which may have poor thermal conductivity. The protrusion of the ground plate surrounding the aperture through a hole in the metal plate avoids the aperture passing through a join between the metal plate and the ground plate, which may otherwise affect the radio frequency performance of the coupling between the first and second transmission lines through the aperture due to the discontinuity of the ground plane.

As also shown in FIG. 6, the signal conductor of the first transmission line 21 may be connected to an antenna patch radiator element, shown in section with reference numeral 33. The ground plate may have a recess provided under the antenna patch radiator element, to improve radiating and reception performance of the patch. It is advantageous to have a thick ground plane, thicker than the width of the slot of the aperture, in order to accommodate the recesses and the metal reinforcing plate between the planes of the first and second transmission lines. The second transmission line may be part of a printed circuit board, for example the conductive tracks could be printed on a layer of a multilayer printed circuit board, for example as part of a radio transceiver. As shown in FIG. 6, the dielectric film 19 may be located over protrusions, also referred to as pips, 30a, 30b. This may facilitate keeping the film 19, which is typically flexible, planar and with a controlled spacing from ground plate 22.

Figure 7:
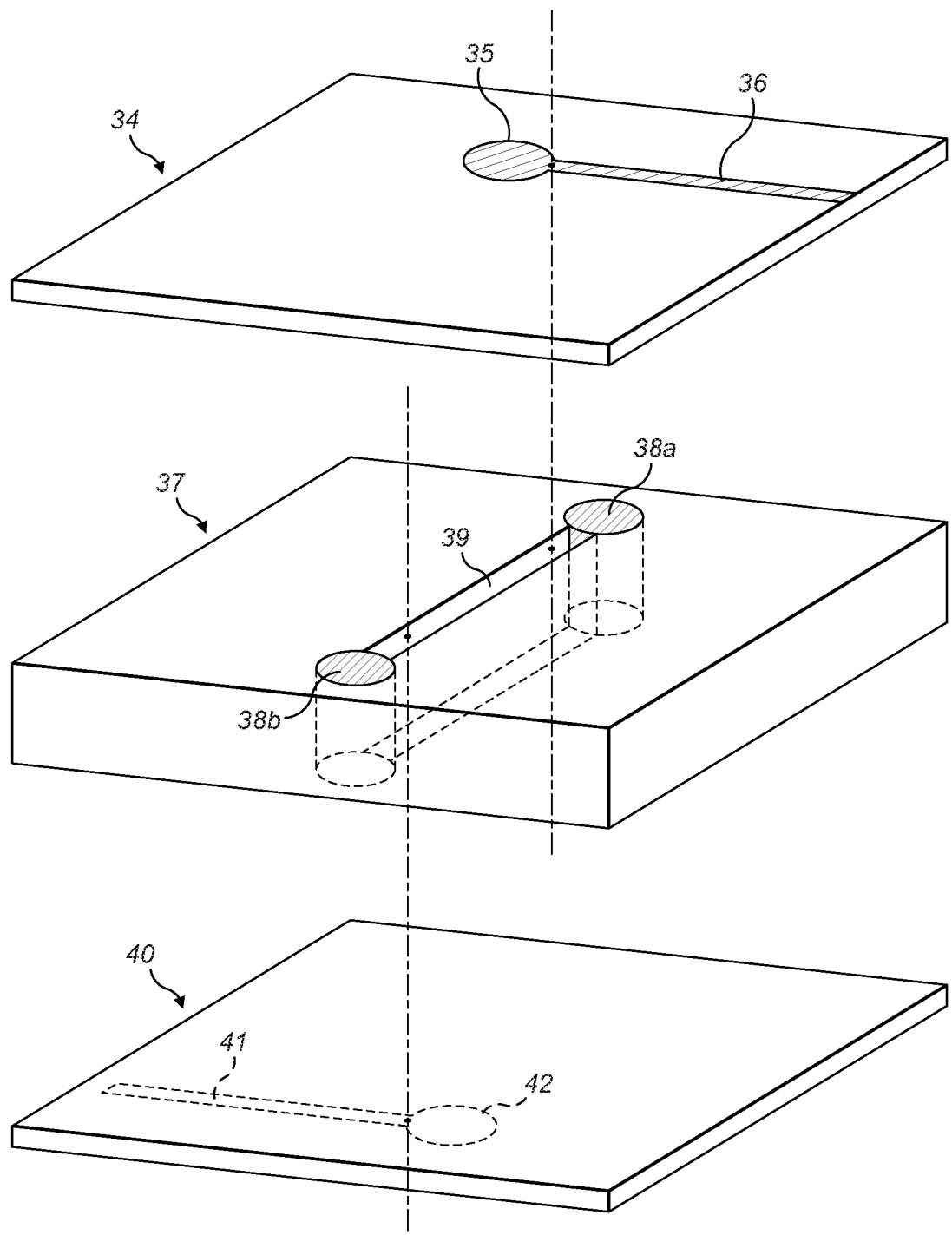
FIG. 7 is a schematic diagram showing an exploded view of a radio frequency transmission arrangement in which the first transmission line is offset laterally from the second transmission line.

FIG. 7 shows an embodiment of the disclosure in which the first transmission line 36 crosses the slot 39 at a point offset along the slot from the point where the second transmission line 41 crosses the slot. This allows the first and second transmission lines to be offset horizontally. This may be convenient in some circuit layouts. In the embodiment shown, the first transmission line 36 has a termination stub 35 and is formed as a printed track on a dielectric substrate 34. In alternative embodiments the dielectric substrate could be a film. The ground plate 37 has an aperture 39, 38a, 38b. The second transmission line comprises a printed track 41 with a termination stub 42 printed on a dielectric substrate 40.

The skilled person would understand that other shapes than those shown could be used for the termination stubs. Typically a shape would be modelled on a computer simulation package and adjusted to give a good impedance match for the radio frequency connection arrangement resulting in a low return loss. The termination stubs have the effect of directing radio frequency energy from the elongate conductor, which is typically microstrip line, down the slot.

In embodiments of the disclosure, the first transmission line is arranged to cross the slot, for example in the in the embodiment of FIG. 1, at a point between the first elongate conductor 12 and the termination stub 11, and the second transmission line is arranged to cross the slot, at a point between the second elongate conductor 17 and the termination stub 18. The termination stub may comprise a section of the same width as the respective elongate conductor. The section of the transmission line that is beyond the slot is in effect part of the termination stub.

Figure 8:
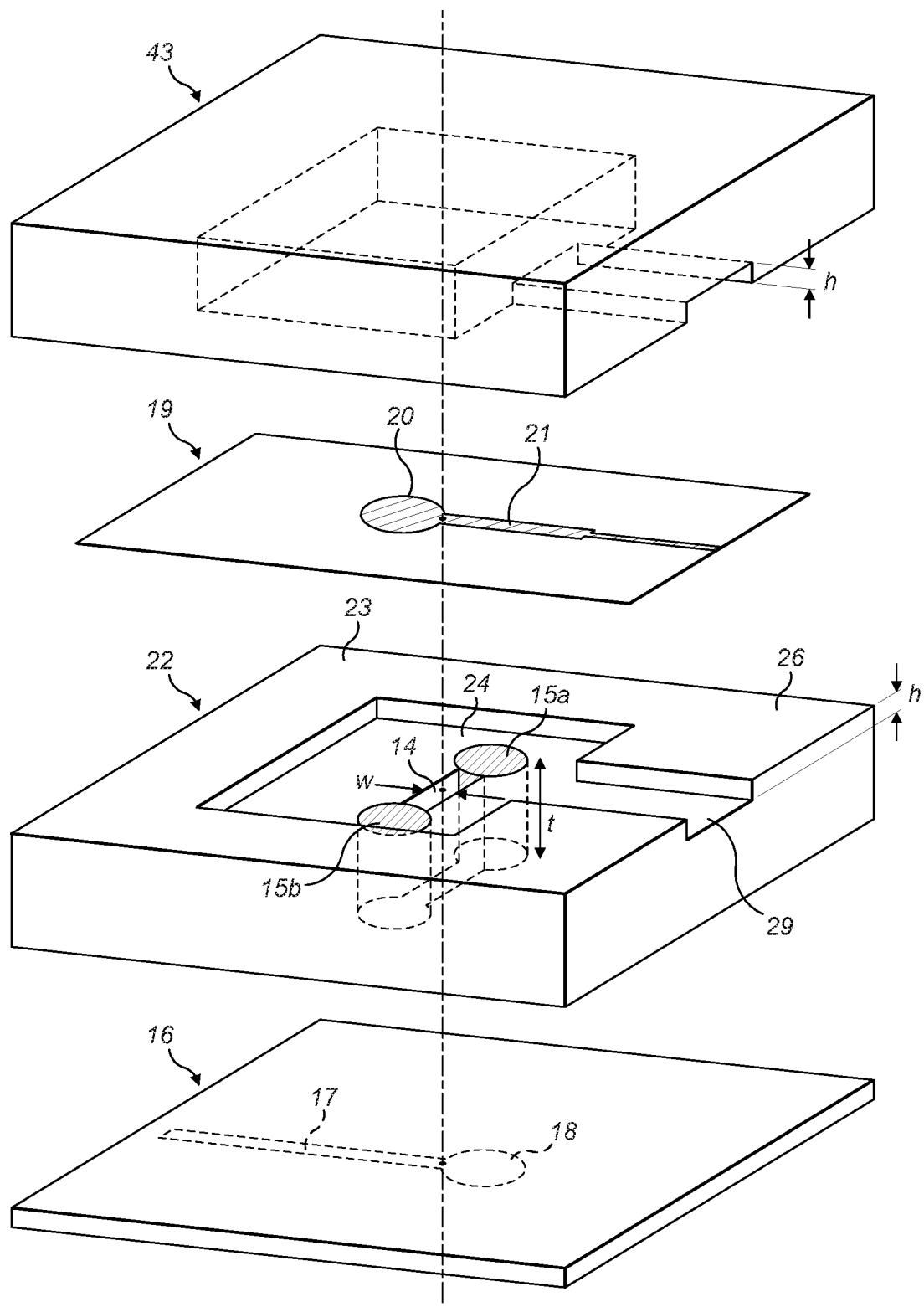
FIG. 8 is a is a schematic diagram showing an exploded view of a radio frequency transmission arrangement comprising an electrically conductive enclosure covering the aperture, in which each termination cavity is filled with a solid dielectric material and the slot is filled with air.
Figure 9:
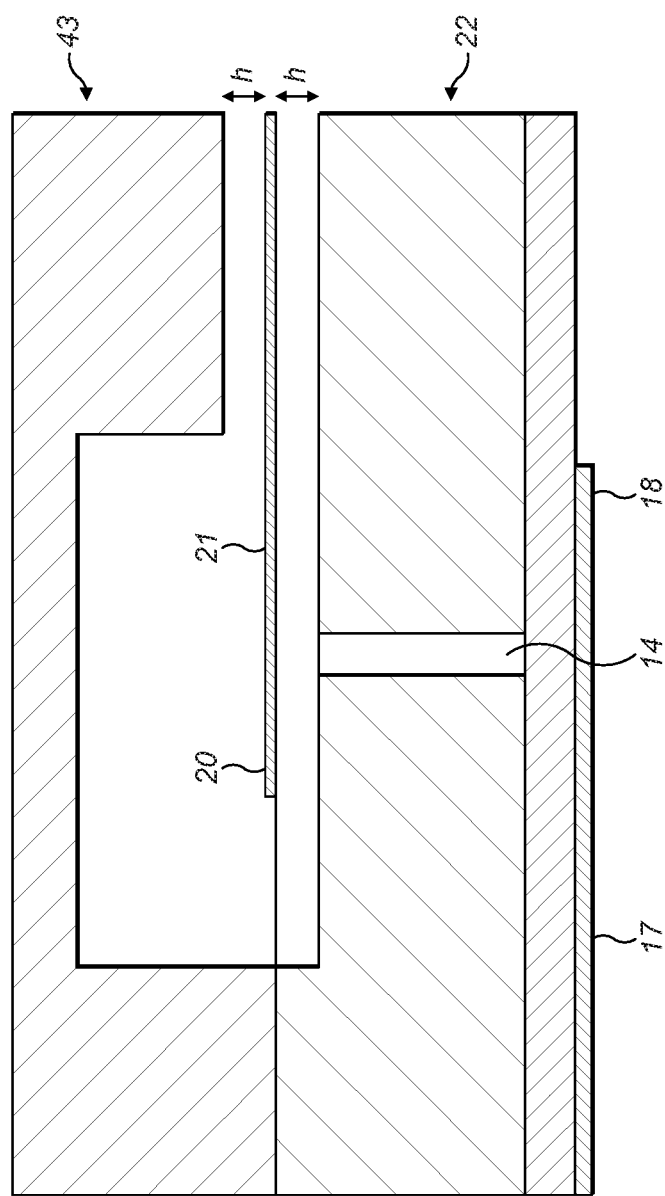
FIG. 9 is a is a schematic diagram showing a cross-section of the radio frequency transmission arrangement of FIG. 8.

FIG. 8 is a is a schematic diagram showing an exploded view of a radio frequency transmission arrangement in an embodiment of the disclosure comprising an electrically conductive enclosure covering the aperture, in which each termination cavity is filled with a solid dielectric material and the slot is filled with air, and FIG. 9 is a schematic diagram showing a cross-section of the radio frequency transmission arrangement of FIG. 8. As can be seen, an electrically conductive enclosure 43, which may also be called a cap or a cover, is disposed on the first side of the ground plate 22. The electrically conductive enclosure 43 is electrically connected to the ground plate, for example by screws or other fixings, which connect through the film 19 supporting the first transmission line 21 in this example. It can be seen that the enclosure has a cavity facing the first side of the ground plate, the walls and top of the cavity being arranged to surround and to cover the aperture and at least part of the first transmission line. The provision of the electrically conductive enclosure allows a low loss implementation by coupling radio frequency signals efficiently between the aperture and the first transmission line, avoiding loss due to radiation from the aperture. It has been found that this may provide a significant improvement in terms of loss performance, so that, for example, a loss through the radiofrequency coupling arrangement of less than 1 dB may be achieved at 4 GHz. Without the cover, the loss performance may be worse by 0.5 dB or more.

As may be seen, the electrically conductive enclosure has an entrance tunnel through a wall of the cavity, the entrance tunnel covering at least part of the first transmission line 21, allowing the first transmission line to enter the cavity. It can be seen that the width of the first transmission line 21 may be reduced where it passes through the tunnel, to maintain a consistent impedance. It may be seen that the distance between the top of the cavity and the first transmission line 21 is at least twice the distance h between the top of the tunnel and the first transmission line. It has been found that, for improved coupling with the aperture, the height of the top of the cavity above the first transmission line, in the vicinity of the aperture, is preferably greater than the distance between the ground plate and the first transmission line, whereas, in the tunnel, the first transmission line is preferably equidistant between the ground plate and the top of the cavity to provide controlled impedance and so good return loss. As shown in FIG. 8, the same distance h is provided between the first transmission line 21 and the ground plate 22 and between the first transmission line 21 the top of the cavity in the electrically conductive enclosure 43. For example, for operation in the range 4.9-8 GHz, the height of the top of the cavity above the first transmission line may be 4 mm and h may be 1 mm.

As shown in the embodiment of FIGS. 8 and 9, the first transmission line may be formed by a printed track on a flexible film 19, with an air gap between the flexible film and the ground plate. The film may for example be a polyester film such as Mylar, with a thickness of 50 micrometres, and a relative permittivity, also known as dielectric constant, of 3.3. The distance between the film 19 and the ground plate 22 is substantially the same as the distance between the film 19 and the top of the tunnel in the electrically conductive enclosure 43. This provides a low loss implementation of the first transmission line due to the dielectric material being predominantly air, while having the distance between the film and the ground plate is substantially the same as the distance between the film and the top of the tunnel reduces the effect on impedance of displacement of the film. This robust transmission line arrangement may be used to provide distribution of RF signals in a variety of applications, and is not limited to use with signals coupled through apertures in a ground plate as in the present embodiment.

Figure 10:
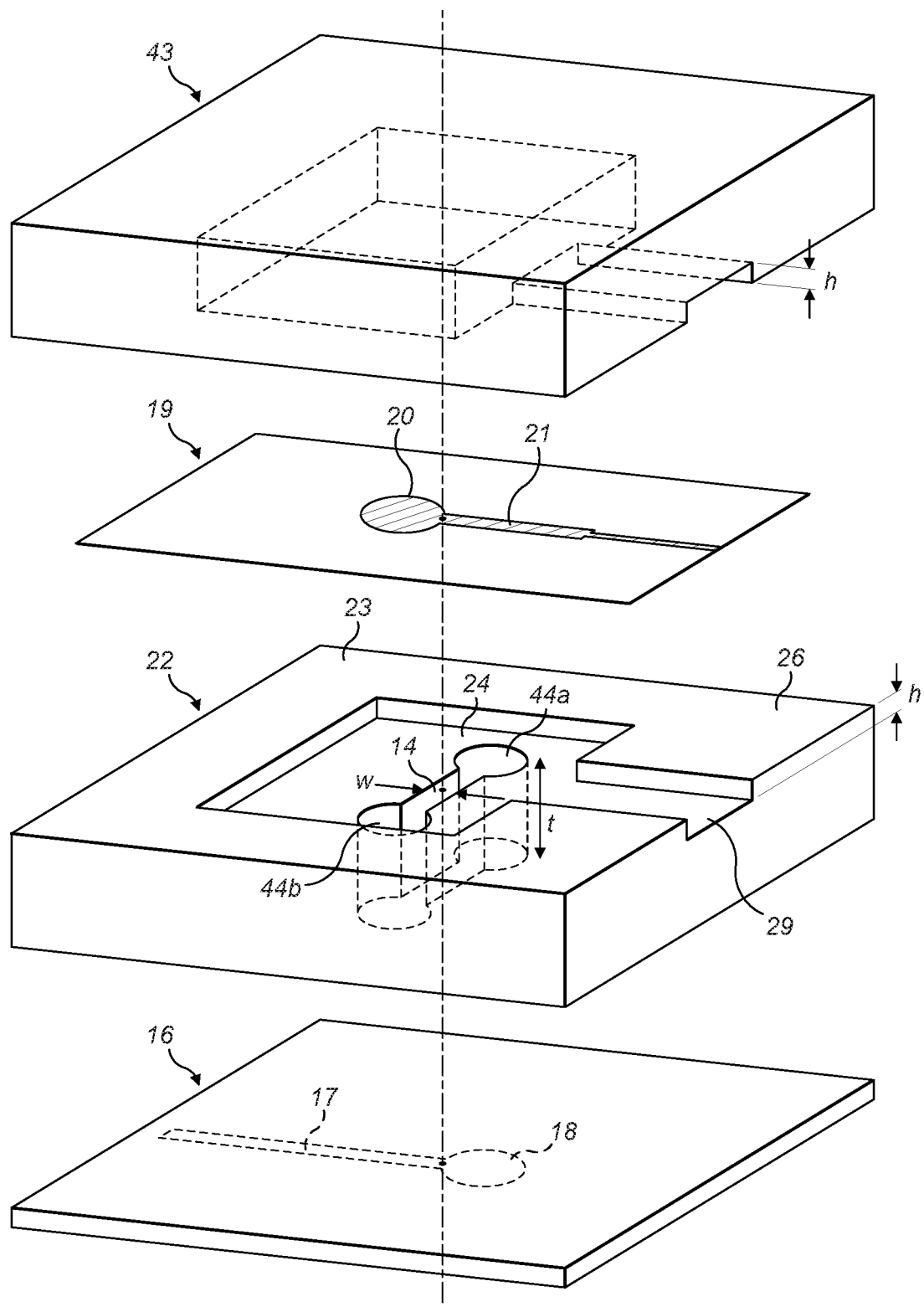
FIG. 10 is a is a schematic diagram showing an exploded view of a radio frequency transmission arrangement comprising an electrically conductive enclosure covering the aperture, in which each termination cavity and the slot is filled with air.

FIG. 10 is a is a schematic diagram showing an exploded view of a radio frequency transmission arrangement comprising an electrically conductive enclosure covering the aperture, in which each termination cavity 44a, 44b and the slot 14 is filled with air. The electrically conductive enclosure arrangement also gives the advantage of lower loss when the aperture is not partially filled with a solid dielectric material.

The above embodiments are to be understood as illustrative examples of the disclosure. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A radio frequency transmission arrangement comprising:
   a ground plate having first and second opposite sides and an aperture formed in the ground plate and passing through the ground plate from the first side to the second side, the aperture comprising a slot, the slot having an elongated cross-section in a plane of the first side of the ground plate, the cross-section having substantially parallel sides extending along a length of the cross section, and the slot having a width which is a distance between the parallel sides of the cross-section of the slot;

a first transmission line comprising a first elongated conductor disposed on the first side of the ground plate in a substantially parallel relationship with the first side of the ground plate, the first transmission line having an end terminated with a first termination stub; and a second transmission line comprising a second elongated conductor disposed on the second side of the ground plate in a substantially parallel relationship with the second side of the ground plate, the second transmission line having an end terminated with a second termination stub, wherein the first transmission line is arranged to cross the slot at a point adjacent to the first termination stub, and the second transmission line is arranged to cross the slot at a point adjacent to the second termination stub, wherein a thickness of the ground plate is greater than the width of the slot, and wherein the aperture formed in the ground plate is partially filled with a solid dielectric material in the ground plate and partially filled with air in the ground plate.

2. The radio frequency transmission arrangement according to claim 1, wherein the aperture comprises a termination cavity at each end of the slot, and each termination cavity is at least partially filled with the solid dielectric material.

3. The radio frequency transmission arrangement according to claim 2, wherein each termination cavity is filled with the solid dielectric material and the slot is filled with air.

4. The radio frequency transmission arrangement according to claim 2, wherein each termination cavity is cylindrical in cross section.

5. The radio frequency transmission arrangement according to claim 4, wherein each cylindrical terminating cavity has a diameter of substantially 0.1 of a wavelength in the solid dielectric material at an operating frequency of the radio frequency transmission arrangement.

6. The radio frequency transmission arrangement according to claim 4, wherein each cylindrical terminating cavity has a circumference of substantially a quarter of a wavelength in the solid dielectric material at an operating frequency of the radio frequency transmission arrangement.

7. The radio frequency transmission arrangement according to claim 1, wherein the ground plate is composed of a non-conductive moulding having an electrically conductive coating.

8. The radio frequency transmission arrangement according to claim 1, wherein the thickness of the ground plate is greater than four times the width of the slot.

9. The radio frequency transmission arrangement according to claim 1, wherein the width of the slot is greater than 1 mm and the thickness of the ground plate is greater than 5 mm.

10. The radio frequency transmission arrangement according to claim 1, wherein the width of the slot is in a range of 1 to 3 mm and the thickness of the ground plate is in a range of 5 to 15 mm.

11. The radio frequency transmission arrangement according to claim 1, wherein the length of the slot is less than a wavelength in air at an operating frequency of the radio frequency transmission arrangement.

12. The radio frequency transmission arrangement according to claim 1, wherein the length of the slot is less than 0.3 of a wavelength in air at an operating frequency of the radio frequency transmission arrangement.

13. The radio frequency transmission arrangement according to claim 1, wherein the first transmission line crosses the slot directly opposite the point where the second transmission line crosses the slot.

14. The radio frequency transmission arrangement according to claim 1, wherein the first transmission line crosses the slot at a point offset along the slot from the point where the second transmission line crosses the slot.

15. The radio frequency transmission arrangement according to claim 1, wherein the first and second terminating stubs have a diameter of substantially 0.1 of a wavelength at an operating frequency of the radio frequency transmission arrangement structure.

16. The radio frequency transmission arrangement according to claim 1, wherein the ground plate has a protrusion from the second side, the protrusion being arranged to pass through an opening in a metal plate disposed in a substantially parallel relationship with the ground plate, and the aperture being arranged to pass through the protrusion, whereby to provide a radio frequency connection through the metal plate to the second transmission line.

17. The radio frequency transmission arrangement according to claim 1, comprising an electrically conductive enclosure disposed on the first side of the ground plate, the electrically conductive enclosure being electrically connected to the ground plate, and having a cavity facing the first side of the ground plate, walls and top of the cavity being arranged to surround and to cover the aperture and at least part of the first transmission line.

18. The radio frequency transmission arrangement according to claim 17, wherein the electrically conductive enclosure has an entrance tunnel through a wall of the cavity, the entrance tunnel covering at least part of the first transmission line, whereby to allow the first transmission line to enter the cavity.

19. The radio frequency transmission arrangement according to claim 18, wherein a distance between the top of the cavity and the first transmission line is at least twice a distance between the top of the tunnel and the first transmission line.

20. The radio frequency transmission arrangement according to claim 18, wherein the first transmission line is formed by a printed track on a flexible film, disposed with an air gap between the flexible film and the ground plate, wherein a distance between the flexible film and the ground plate is substantially the same as a distance between the flexible film and a top of the tunnel.

* * * * *